US012635078B2

(12) United States Patent
Yaklin et al.

(10) Patent No.: US 12,635,078 B2

(45) **Date of Patent: *May 19, 2026**

(54) NON-SYMMETRIC SINGLE CIRCUIT BOARD ASSEMBLY WITH DIELECTRIC MATERIAL

(71) Applicant: Steering Solutions IP Holding Corporation, Saginaw, MI (US)

(72) Inventors: Ryan D. Yaklin, Chesaning, MI (US); Steven J. Collier-Hallman, Frankenmuth, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 234 days.

This patent is subject to a terminal disclaimer.

(21) Appl. No.: 18/322,870

(22) Filed: May 24, 2023

(65) Prior Publication Data

US 2023/0389183 A1      Nov. 30, 2023

Related U.S. Application Data

(60) Provisional application No. 63/346,021, filed on May 26, 2022.

(51) Int. Cl.
H05K 1/18 (2026.01)
H02K 9/00 (2006.01)
(Continued)

(52) U.S. Cl.
CPC ............... H05K 1/181 (2013.01); H02K 9/00 (2013.01); H05K 1/09 (2013.01); H05K 2201/1009 (2013.01)

(58) Field of Classification Search
CPC ...... H05K 1/0298; H05K 1/0296; H05K 1/18; H05K 1/181; H05K 1/182; H05K 1/09;
(Continued)

(56) References Cited

U.S. PATENT DOCUMENTS

| | | | | | |
|---|---|---|---|---|---|
| 5,110,664 | A | * | 5/1992 | Nakanishi | ............ H05K 3/4605 428/209 |
| 5,375,042 | A | * | 12/1994 | Arima | ..................... H01L 23/10 361/810 |

(Continued)

FOREIGN PATENT DOCUMENTS

| | | | | | |
|---|---|---|---|---|---|
| CN | 1336789 | A | * | 2/2002 | ........... H05K 3/4069 |
| CN | 100548089 | C | * | 10/2009 | ............. H05K 1/162 |

(Continued)

OTHER PUBLICATIONS

Oscar Yang, Thermal Management Solutions, Dec. 14, 2010, Polytronics Technology Corp. , pp. 1, 4, 16, 17 and 21-33.*

*Primary Examiner* — Edgardo San Martin

(74) *Attorney, Agent, or Firm* — Dickinson Wright PLLC

(57)      ABSTRACT

A single circuit board assembly for forming a vehicle-motor interface includes a first side of a board with logic modules located thereon. The single circuit board assembly also includes a second side of the board with power modules located thereon. The board includes a first plurality of layers and a second plurality of layers, and a dielectric layer disposed between adjacent layers of the first plurality of layers and/or the second plurality of layers, the dielectric layer comprising polytronics material.

13 Claims, 6 Drawing Sheets

(51) Int. Cl.

| | | |
|---|---|---|
| *H02K 11/33* | (2016.01) |
| *H05K 1/09* | (2006.01) |
| *H05K 1/181* | (2026.01) |
| *H05K 3/10* | (2006.01) |
| *H05K 3/46* | (2006.01) |

(58) Field of Classification Search
CPC ...... H05K 3/0058; H05K 3/0061; H05K 3/10;
H05K 3/46; H05K 7/20; H05K 7/209;
H05K 2201/1009; H05K 2201/10007;
H05K 2201/10; H02K 11/30; H02K 11/33
See application file for complete search history.

(56) References Cited

U.S. PATENT DOCUMENTS

| | | | | |
|---|---|---|---|---|
| 5,888,631 | A * | 3/1999 | Sylvester | H05K 3/4688 |
| | | | | 428/209 |
| 6,329,610 | B1 * | 12/2001 | Takubo | H05K 3/4691 |
| | | | | 174/255 |
| 6,459,046 | B1 * | 10/2002 | Ochi | H05K 3/4069 |
| | | | | 174/262 |
| 6,747,356 | B2 * | 6/2004 | Ando | H01L 23/66 |
| | | | | 257/772 |
| 8,125,074 | B2 * | 2/2012 | Slavov | H01L 23/49822 |
| | | | | 257/E23.173 |
| 8,942,006 | B2 * | 1/2015 | Baker | H05K 1/024 |
| | | | | 174/251 |
| 10,690,716 | B2 * | 6/2020 | Kanematsu | H05K 3/064 |
| 11,202,368 | B2 * | 12/2021 | Goergen | H05K 1/09 |
| 11,291,119 | B2 * | 3/2022 | Tuominen | H05K 1/189 |
| 12,324,093 | B2 * | 6/2025 | Yaklin | H02K 11/33 |
| 2016/0324015 | A1 * | 11/2016 | Mutsuura | H05K 7/1417 |
| 2017/0066955 | A1 * | 3/2017 | Chen | C09K 5/14 |
| 2017/0367185 | A1 * | 12/2017 | Roessler | H05K 3/0047 |
| 2019/0115806 | A1 * | 4/2019 | Yamashita | H05K 7/20 |
| 2019/0207488 | A1 * | 7/2019 | Ichikawa | H02K 5/10 |
| 2020/0146148 | A1 * | 5/2020 | Higashide | H05K 5/006 |
| 2022/0394848 | A1 * | 12/2022 | Yaklin | H05K 3/4688 |
| 2023/0032026 | A1 * | 2/2023 | Aupee | H05K 1/0218 |
| 2023/0389177 | A1 * | 11/2023 | Yaklin | H05K 7/1427 |

FOREIGN PATENT DOCUMENTS

| | | | | | | |
|---|---|---|---|---|---|---|
| CN | 104602444 | A | * | 5/2015 | | |
| CN | 105101623 | B | * | 12/2018 | ........ | H05K 1/0298 |
| CN | 115134991 | A | * | 9/2022 | | |
| KR | 20050083298 | A | * | 8/2005 | ........ | H05K 3/4641 |
| WO | WO-2011003647 | A1 | * | 1/2011 | ........ | H05K 1/0203 |
| WO | WO-2023224625 | A1 | * | 11/2023 | ........ | H05K 1/144 |

* cited by examiner

NON-SYMMETRIC SINGLE CIRCUIT BOARD ASSEMBLY WITH DIELECTRIC MATERIAL

CROSS-REFERENCE TO RELATED APPLICATION

This application claims priority to U.S. Provisional Patent Application Ser. No. 63/346,021, filed May 26, 2022, the disclosure of which is incorporated by reference herein in its entirety.

TECHNICAL FIELD

This disclosure relates to a circuit board assembly and, in particular, to a non-symmetric single circuit board assembly with both logic and power components, as well as dielectric material.

BACKGROUND

A vehicle, such as a car, truck, sport utility vehicle, crossover, mini-van, marine craft, aircraft, all-terrain vehicle, recreational vehicle, or other suitable vehicles, typically include various electric motor-vehicle interface locations. Electric motors may be used throughout the vehicle for a variety of functions, such as power steering, steering column adjustment, and other functionalities. These motors typically receive instructions from a circuit board assembly that facilitates the motor-vehicle interface. Circuit boards (e.g., a printed circuit board) locate and connect various electronic components and thus design and packaging considerations are important for end-use.

Typical motor-vehicle interfaces require a multi-circuit board configuration wherein a series of single-sided circuit boards locate and connect logic components and high power components. The series of single-sided circuit boards are then electrically connected via a number of conduction intermediaries to form the multi-circuit board configuration. The multi-circuit board configuration is then electrically connected to a motor. While the multi-circuit board configuration is functionally operable, packaging options are limited by the size. FIG. 1 generally illustrates one example of such a multi-board assembly in a disassembled condition.

Accordingly, there is a continuing interest in reducing the size of the traditional circuit board configurations to adhere to reduced packaging space requirements without detracting from functionality.

SUMMARY OF THE DISCLOSURE

According to one aspect of the disclosure, a single circuit board assembly for forming a vehicle-motor interface includes a first side of a board with logic modules located thereon. The single circuit board assembly also includes a second side of the board with power modules located thereon. The board includes a first plurality of layers and a second plurality of layers, and a dielectric layer disposed between adjacent layers of the first plurality of layers and/or the second plurality of layers.

According to another aspect of the disclosure, a motor assembly for a vehicle steering system includes a motor housing. The motor assembly also includes a heat sink assembly operatively connected to an end of the motor housing, wherein the heat sink assembly defines a pocket on a single side of the heat sink assembly. The motor assembly further includes a circuit board assembly in operative communication with the motor housing and disposed at least partially within the pocket of the heat sink assembly. The circuit board assembly includes a first side of a board with logic modules located thereon. The circuit board assembly also includes a second side of the board with power modules located thereon. The board includes a first plurality of layers and a second plurality of layers, and a dielectric layer disposed between adjacent layers of the first plurality of layers and/or the second plurality of layers.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the disclosure. The embodiments disclosed herein should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, a vehicle, such as a car, truck, sport utility vehicle, crossover, mini-van, marine craft, aircraft, all-terrain vehicle, recreational vehicle, or other suitable vehicles, typically include various motor-vehicle interface locations. The motors described herein may be used throughout the vehicle for a variety of functions, such as power steering, steering column adjustment, and other functionalities.

Figure 1:
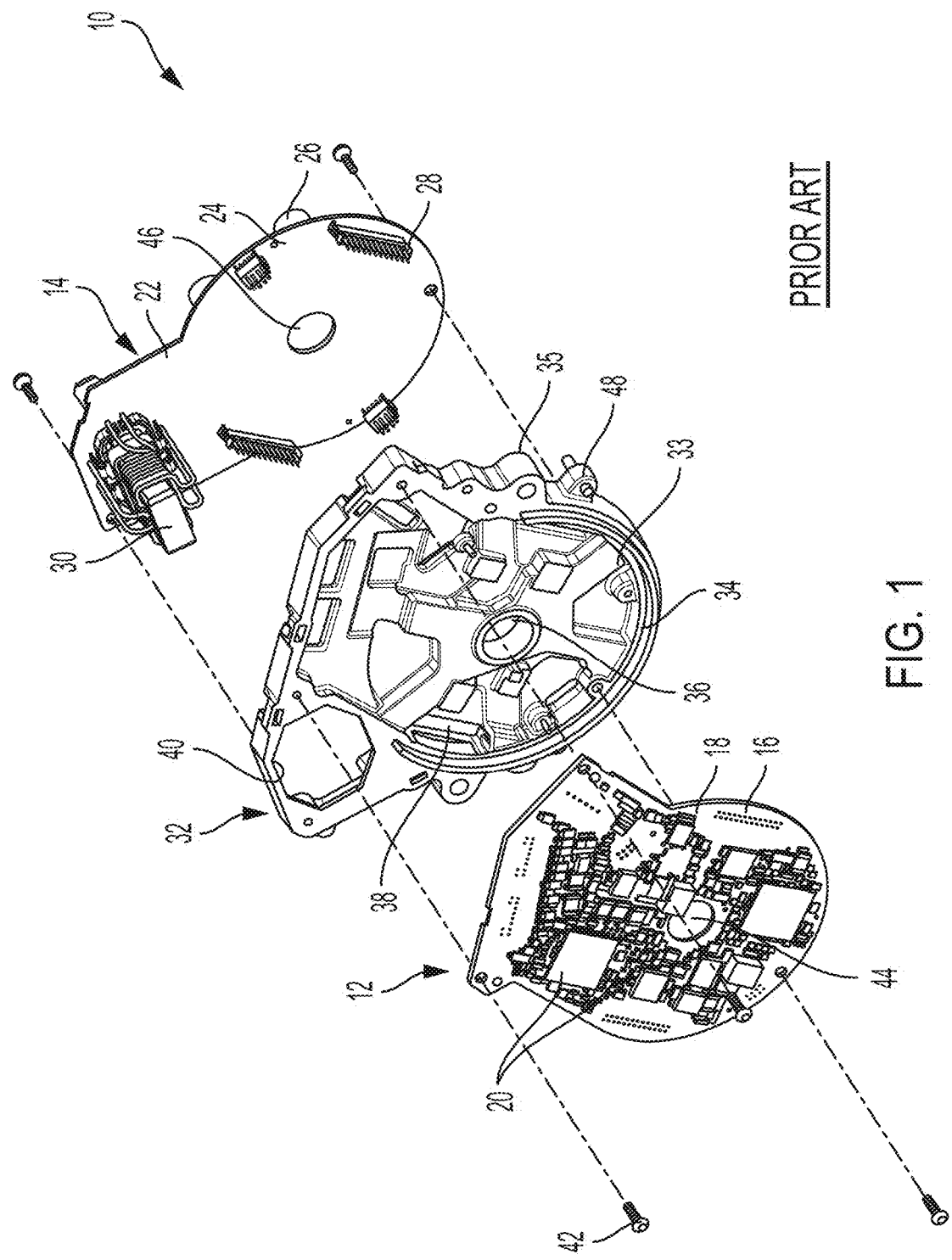
FIG. 1 generally illustrates a single circuit board assembly according to a prior art circuit board assembly requiring multiple boards.
Figure 2:
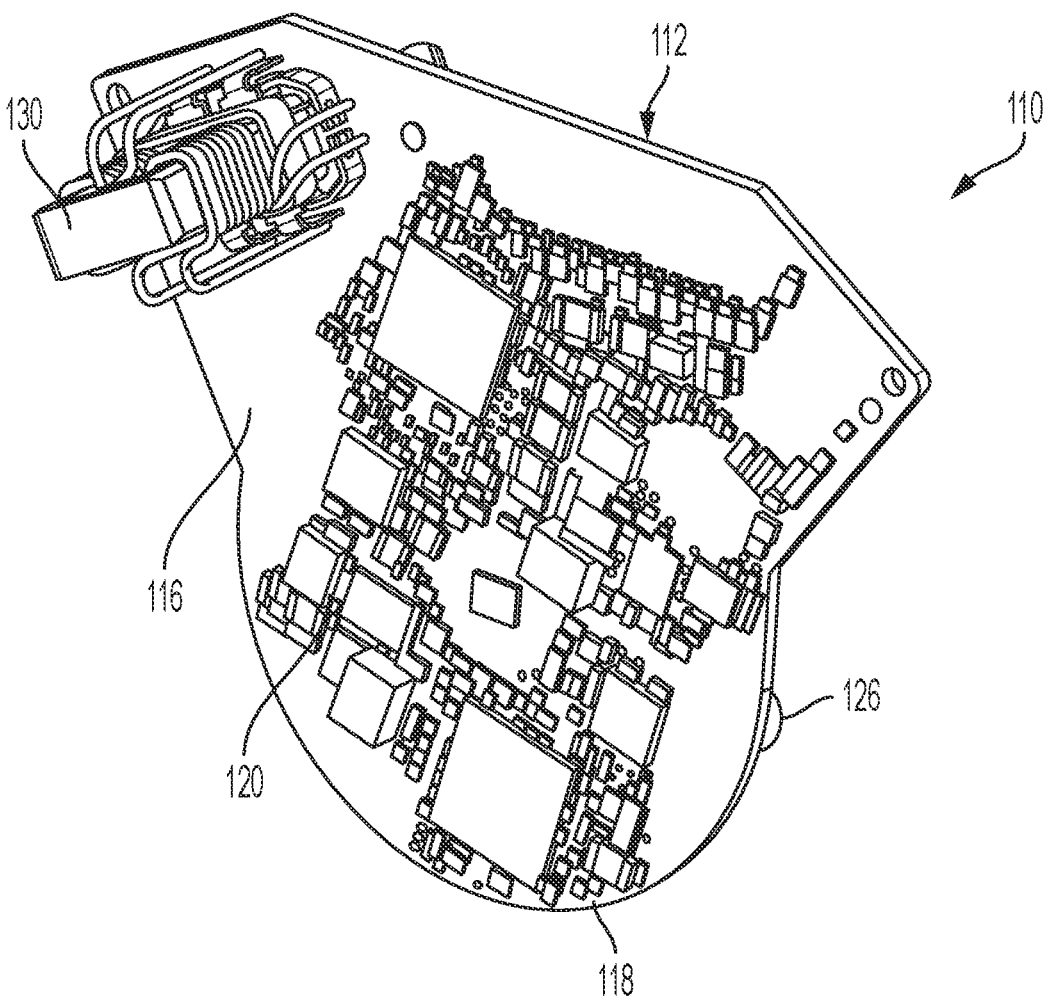
FIG. 2 is a perspective view of a first side of a single circuit board assembly according to the present disclosure.
Figure 3:
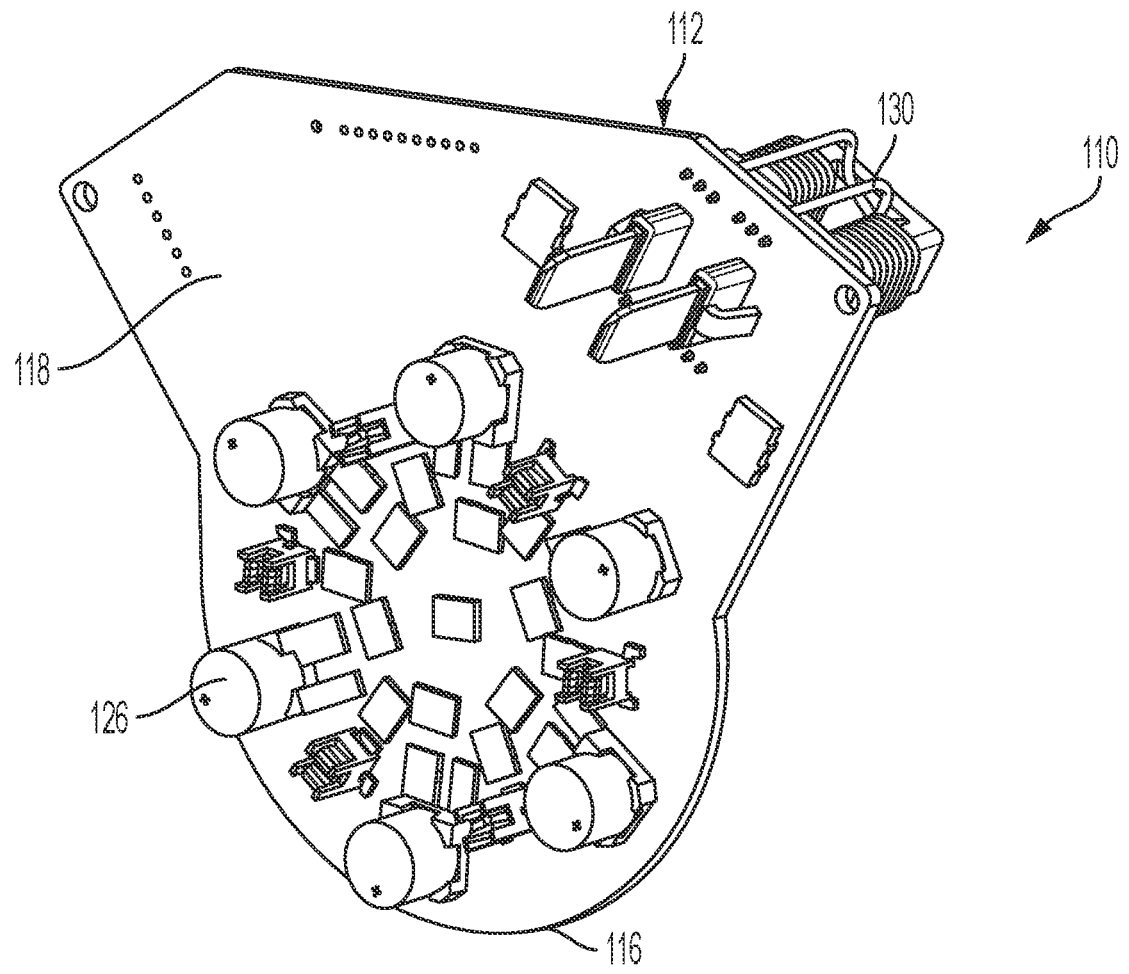
FIG. 3 is a perspective view of a second side of the single circuit board assembly.
Figure 4:
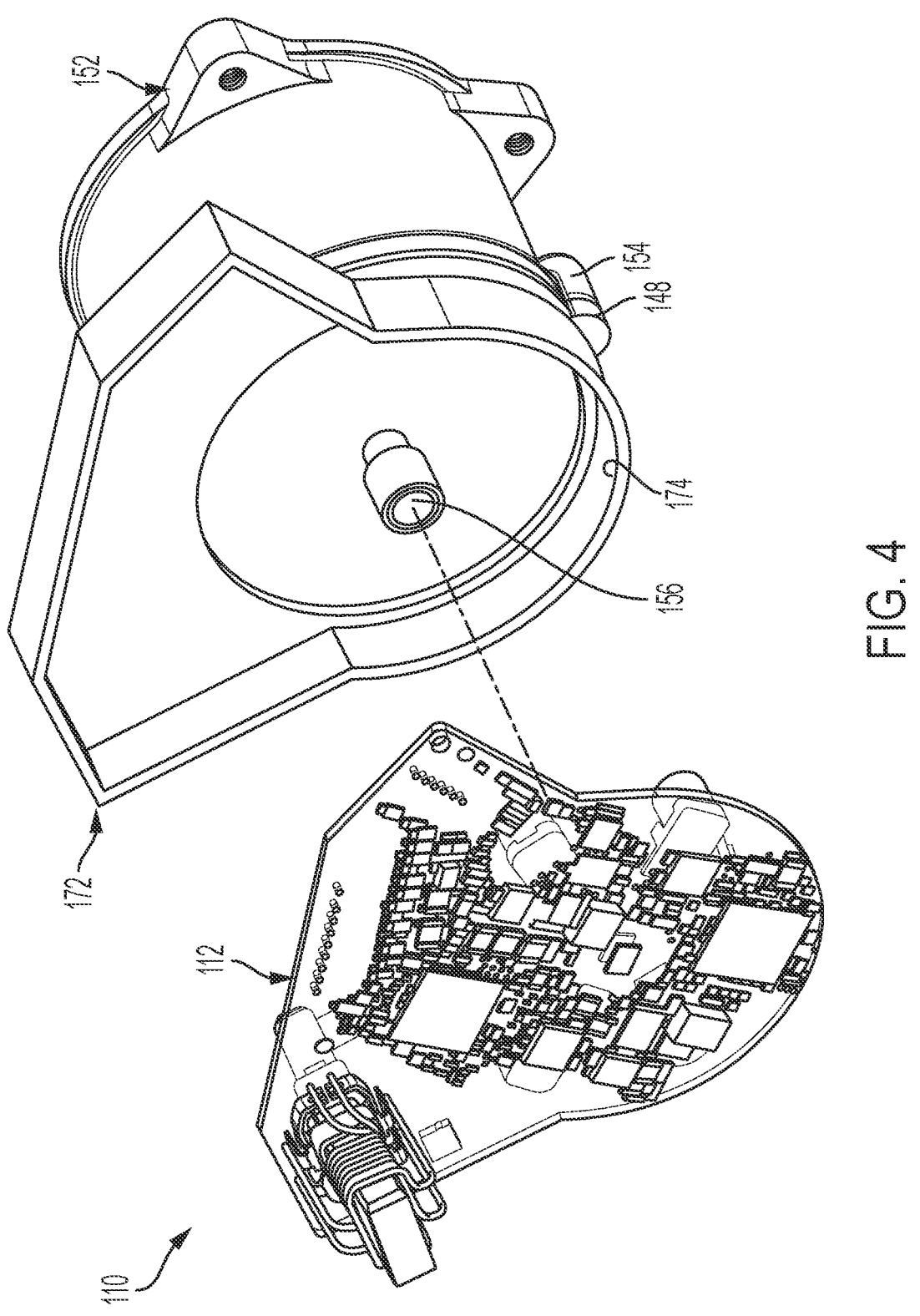
FIG. 4 generally illustrates the single circuit board assembly and a motor assembly according to the principles of the present disclosure.

FIGS. 2 and 3 illustrate a circuit board assembly 110 in accordance with an embodiment of the present disclosure. The circuit board assembly 110 utilizes a single circuit board 112 having a first side 116 and a second side 118. In some embodiments, the first side 116 includes a series of logic modules 120 and the second side 118 includes a series of power modules 126, such as high powered FETS, shunts, and other components. The second side 118 may further include a motor connection module 130 for connecting to a motor assembly 152 (FIG. 4). By locating the power modules 126 (e.g., the high powered FETS) on the second side 118, they are accessible for cooling schemes. A conduction assembly 132 (FIG. 6) may be located between the first side 116 and the second side 118. In some embodiments, the logic modules 120 and the power modules 126 are located directly across from each other.

Figure 5:
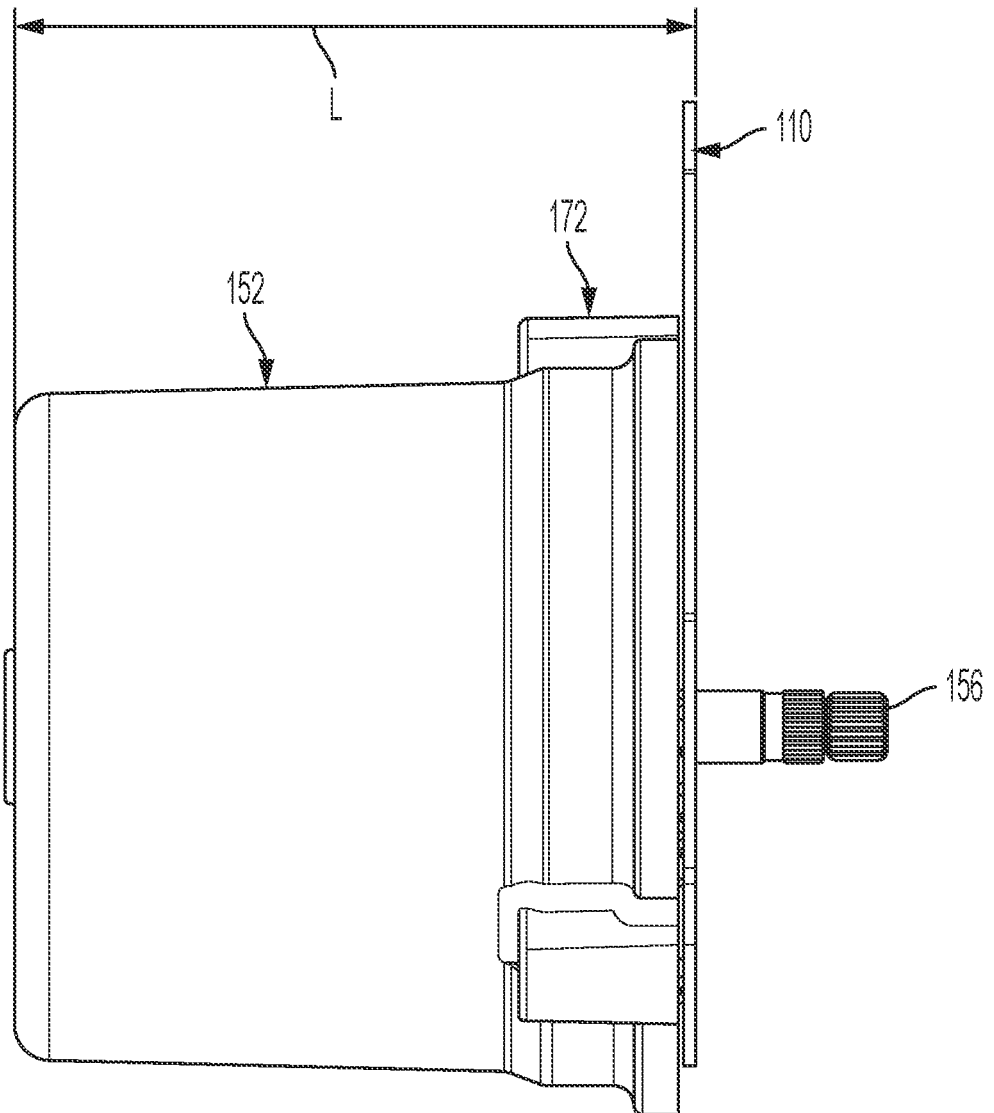
FIG. 5 generally illustrates the single circuit board assembly and a motor assembly from a side view according to the principles of the present disclosure.

FIG. 4 illustrates the circuit board assembly 110 and the motor assembly 152 spaced therefrom for connection. The motor assembly 152 includes a heat sink assembly 172 for locating the circuit board assembly 110. The heat sink assembly 172 includes motor mounting tabs 148 for connecting to heat sink tabs 154 on the motor assembly 152. The heat sink assembly 172 may define a pocket 174 for locating the circuit board assembly 110. A hole may be located within the pocket 174 and the circuit board assembly 110 (not shown) for locating a motor shaft 156. FIG. 5 illustrates a side view of the circuit board assembly 110 connected to the motor assembly 152.

Figure 6:
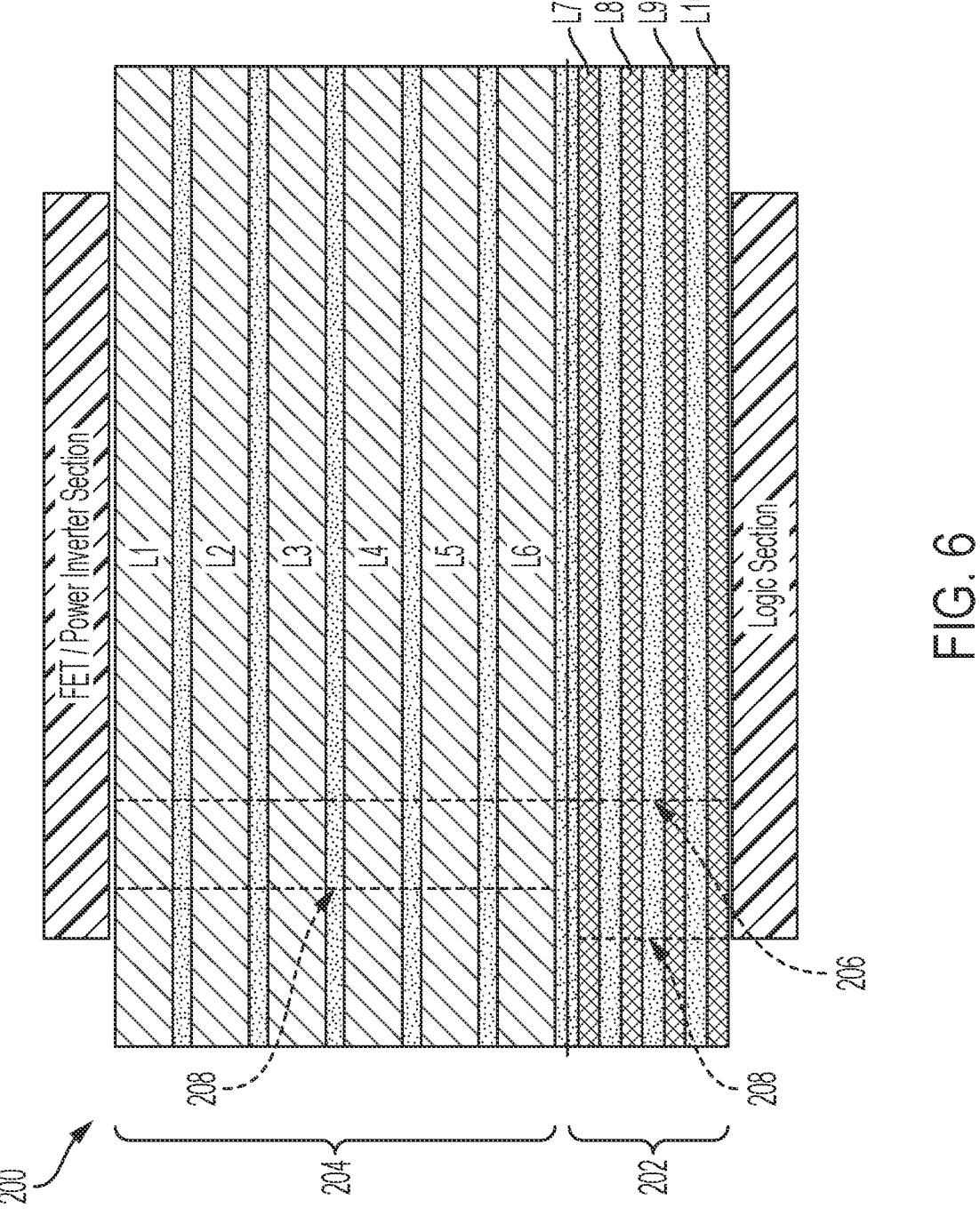
FIG. 6 generally illustrates a cross-sectional view of a conduction assembly according to the principles of the present disclosure.

FIG. 6 illustrates a cross-sectional view of the conduction assembly 132 that may be utilized in accordance with the embodiments disclosed herein. In some embodiments, the plurality of conduction layers 200 may be formed of copper with dielectric layers disposed between the plurality of conduction layers 200. By using the non-symmetrical PCB structure described herein and the dielectrics of the PCB, the coefficient of thermal expansion (CTE) for the dielectrics can be controlled to be substantially equal. This lessens the amount of bow and twist of the PCB due to the non-symmetrical PCB structure.

The plurality of conduction layers 200 may include a first plurality of layers 202 for facilitating logic signals from the logic modules 120 and a second plurality of layers 204 for facilitating high current signals from the power modules 126. In some embodiments, the first plurality of layers 202 are fewer in number than the second plurality of layers 204. In some embodiments, one or more of the first plurality of layers 202 closest to the logic modules have a different thickness than one or more of the second plurality of layers 204 closest to the power modules. In other words, the conduction assembly 132 is non-symmetric with respect to the thickness of the layers on each extreme side of the conduction assembly 132. In the illustrated embodiment, the plurality of conduction layers 200 includes 10 copper layers of which the first plurality of layers 202 includes four (4) copper layers and the second plurality of layers 204 includes six (6) copper layers. In the illustrated embodiment, each of the layers of the first plurality of layers 202 has a weight ranging from approximately 0.5 oz. to approximately 1.0 oz., while each of the layers of the second plurality of layers 204 has a weight ranging from approximately 2.0 oz. to approximately 3.0 oz. However, it is to be appreciated that heavier layers may be utilized in some embodiments.

In some embodiments, the first plurality of layers 202 are sub-divided as having different thicknesses among certain groups. For example, the first plurality of layers 204 may have a plurality of layers adjacent the first side of the board and another group of layers may be located between the second plurality of layers 204 and the layers immediately adjacent the first side. In some embodiments, the second plurality of layers 204 are sub-divided as having different thicknesses amount certain groups. For example, the second plurality of layers 204 may have a plurality of layers adjacent the second side of the board and another group of layers may be located between the first plurality of layers 202 and the layers immediately adjacent the second side. The following is a non-limiting example:

| | thckness um |
|---|---|
| L1 cap plate | 15 |
| L1 plate 2 | 30 |
| L1 plate 1 | 30 |
| L1 2 oz | 70 |
| die 1 | 150 Polytronics SFL-4 Material |
| L2 3 oz | 105 |
| die 2 | 150 Polytronics SFL-4 Material |
| L3 3 oz | 105 |
| die 3 | 150 Polytronics SFL-4 Material |
| L4 3 oz | 105 |
| die 4 | 150 Polytronics SFL-4 Material |
| L5 3 oz | 105 |
| die 5 | 150 Polytronics SFL-4 Material |
| L6 3 oz | 105 |
| Thickness Stack one | 1420 um |
| | 1.42 mm |
| die 6 | 150 Polytronics SFL-4 Material |
| L7 plate | 30 |
| L7 .5 oz | 17 |
| die 7 | 150 Polytronics SFL-4 Material |
| L8 .5 oz | 17 |
| die 8 | 150 Polytronics SFL-4 Material |
| L9 .5 oz | 17 |
| die 9 | 150 Polytronics SFL-4 Material |
| L10 .5 oz | 17 |
| L10 plate 1 | 30 |
| L10 plate 2 | 30 |
| L10 cap plate | 15 |
| thickness stack 2 | 623 um |
| | 0.623 mm |
| total thickness um | 2193 |
| total thickness mm | 2.193 |
| Solder mask | 2.353 |
| Total PCB thickness | 2.353 |

Regardless of the relative thickness, the layers are arranged to form a non-symmetric conduction assembly 132, as described above. By using a non-symmetrical PCB structure, any combination of weights (e.g., copper weights) for high power components may be utilized with lower copper weight on the logic nonsymmetrical PCB to allow for smaller copper-to-copper spacing for the logic section.

With continued reference to FIG. 6, the heat sink assembly 32, 132 may include through vias 206 extending through each layer 200 and buried vias 208 extending through only certain layers 200. The different types of vias separate the high power electrical connection (of the power modules) routing from the logic copper routing (of the logic modules). The quantity, ratio, and distribution of different via connection 206, 208 types from layer-to-layer 200 may be less than or greater than what is shown in FIG. 6. The vias 206, 208 permit electrical current passage from one layer 200 of copper to another layer 200 of copper. The vias 206, 208 may be formed with a drill that goes from one layer to another and then is put in a fabrication plating process that plates copper on the wall of the hole making electrical connection from one layer 200 of copper to another layer 200 of copper.

Advantageously, the embodiments disclosed herein provide high powered and logic components on the same circuit board.

While the invention has been described in detail in connection with only a limited number of embodiments, it is to be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Moreover, any feature, element, component or advantage of any one embodiment can be used on any of the other embodiments. Accordingly, the invention is not to be seen as limited by the foregoing description.

What is claimed is:

1. A single circuit board assembly for forming a vehicle-motor interface, the single circuit board assembly comprising:
   a first side of a board with logic modules located thereon;
   a second side of the board with power modules located thereon;
   wherein the board comprises a first plurality of layers and a second plurality of layers, wherein the first plurality of layer and the second plurality of layers are formed of copper, the board further comprising a dielectric layer disposed between adjacent layers of the first plurality of layers and/or the second plurality of layers, wherein the dielectric layer is one of a plurality of dielectric layers, each of the plurality of dielectric layers disposed between a respective pair of adjacent layers of the first plurality of layers and the second plurality of layers, wherein the first plurality of layers are located adjacent the first side of the board and the second plurality of layers are located adjacent the second side of the board, wherein the first plurality of layers has a first total thickness and the second plurality of layers has a second total thickness, wherein the first total thickness is different than the second total thickness.

2. The single circuit board assembly of claim 1, wherein each of the layers of the first plurality of layers has a weight ranging from approximately 0.5 oz. to approximately 1.0 oz.

3. The single circuit board assembly of claim 1, wherein each of the layers of the second plurality of layers has a weight ranging from approximately 2.0 oz. to approximately 3.0 oz.

4. The single circuit board assembly of claim 1, wherein at least one of the first plurality of layers and at least one of the second plurality of layers have a different thickness.

5. The single circuit board assembly of claim 4, wherein each of the first plurality of layers have the same thickness.

6. The single circuit board assembly of claim 4, wherein at least one of the first plurality of layers has a thickness that is different from a thickness of another layer of the first plurality of layers.

7. The single circuit board assembly of claim 4, wherein each of the second plurality of layers have the same thickness.

8. The single circuit board assembly of claim 4, wherein at least one of the second plurality of layers has a thickness that is different from a thickness of another layer of the second plurality of layers.

9. A motor assembly for a vehicle steering system comprising:
   a motor housing;
   a heat sink assembly operatively connected to an end of the motor housing, wherein the heat sink assembly defines a pocket on a single side of the heat sink assembly; and
   a circuit board assembly in operative communication with the motor housing and disposed at least partially within the pocket of the heat sink assembly, the circuit board assembly comprising:
      a first side of a board with logic modules located thereon;
      a second side of the board with power modules located thereon;
      wherein the board comprises a first plurality of layers and a second plurality of layers, wherein each of the layers are formed of copper, the board further comprising a dielectric layer disposed between adjacent layers of the first plurality of layers and/or the second plurality of layers, wherein the first plurality of layers has a first total thickness and the second plurality of layers has a second total thickness, wherein the first total thickness is different than the second total thickness.

10. The motor assembly of claim 9, wherein each of the layers of the first plurality of layers has a weight ranging from approximately 0.5 oz. to approximately 1.0 oz., wherein each of the layers of the second plurality of layers has a weight ranging from approximately 2.0 oz. to approximately 3.0 oz.

11. The motor assembly of claim 9, wherein at least one of the first plurality of layers and at least one of the second plurality of layers have a different thickness.

12. The motor assembly of claim 9, wherein at least one of the first plurality of layers has a thickness that is different from a thickness of another layer of the first plurality of layers.

13. The motor assembly of claim 9, wherein at least one of the second plurality of layers has a thickness that is different from a thickness of another layer of the second plurality of layers.

* * * * *